(12) United States Patent
Nawata et al.

(10) Patent No.: US 8,264,083 B2
(45) Date of Patent: Sep. 11, 2012

(54) SEMICONDUCTOR DEVICE AND SEMICONDUCTOR DEVICE MANUFACTURING METHOD

(75) Inventors: Hidefumi Nawata, Kanagawa-ken (JP); Kikuko Sugimae, Kanagawa-ken (JP); Akihiro Kajita, Kanagawa-ken (UA); Takamichi Tsuchiya, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 278 days.

(21) Appl. No.: 12/548,820

(22) Filed: Aug. 27, 2009

(65) Prior Publication Data
US 2010/0052173 A1    Mar. 4, 2010

(30) Foreign Application Priority Data
Aug. 27, 2008    (JP) .................. 2008-218353

(51) Int. Cl.
*H01L 23/48* (2006.01)
*H01L 23/52* (2006.01)
(52) U.S. Cl. ......... 257/758; 257/211; 438/642; 438/188
(58) Field of Classification Search ............... 257/758, 257/211, E23.157, E21.575; 438/642, 118
See application file for complete search history.

(56) References Cited

U.S. PATENT DOCUMENTS

| 5,792,687 A * | 8/1998 | Jeng et al. | 438/253 |
| 6,150,707 A * | 11/2000 | Cook et al. | 257/535 |
| 2001/0019144 A1* | 9/2001 | Roy | 257/296 |

FOREIGN PATENT DOCUMENTS

| JP | 2000-114259 | 4/2000 |
| JP | 2004-047626 | 2/2004 |
| JP | 2004-253555 | 9/2004 |

* cited by examiner

*Primary Examiner* — Theresa T Doan
(74) *Attorney, Agent, or Firm* — Oblon, Spivak, McClelland, Maier & Neustadt, L.L.P.

(57) ABSTRACT

A first impurity diffusion layer in a memory cell portion and a second impurity diffusion layer in a peripheral circuit portion are provided in a surface of a semiconductor substrate and having upper faces substantially flush with each other. First and second insulating films are formed to cover the upper faces of the impurity diffusion layers, and having substantially uniform film thicknesses. A first metal plug is formed in the insulating films, and connected to the first impurity diffusion layer. A second metal plug is formed in the first insulating film, to have a lower height than the first metal plug, and is connected to the second impurity diffusion layer. A first metal interconnection is connected to an upper end portion of the first metal plug, and having an upper face embedded in and flush with the second insulating film. A second metal interconnection is connected to an upper end portion of the second metal plug, and having an upper face embedded in and flush with the second insulating film.

9 Claims, 12 Drawing Sheets

SEMICONDUCTOR DEVICE AND SEMICONDUCTOR DEVICE MANUFACTURING METHOD

CROSS-REFERENCE TO RELATED APPLICATIONS

This application is based upon and claims the benefit of priority from the prior Japanese Patent Application No. 2008-218353, filed Aug. 27 2008, the entire contents of which are incorporated herein by reference.

BACKGROUND OF THE INVENTION

1. Field of the Invention

The present invention relates to a semiconductor device and a semiconductor device manufacturing method.

2. Description of the Related Art

In semiconductor devices such as a memory, an increase in capacity and a shrinking in size are desired. Particularly in a memory cell array shrinking of the width of the interconnections, and narrowing of the pitch between adjacent ones of the interconnections have been in progress along with shrinking of the interconnections. When the pitch of the interconnections is narrowed, the capacitances between the interconnections become conspicuous. To reduce the capacitances, mutually facing areas of adjacent ones of the lines are reduced by thinning the thickness of an interconnection. On the other hand, in a control circuit (peripheral circuit portion) or the like, it is required that a power supply is reduced and the interconnections have low resistances. For this reason, it is necessary that interconnection lines having relatively wide widths should be arranged in the same interconnection layer where the miniaturized interconnections having a narrower pitch are disposed.

In semiconductor devices of recent years, damascene interconnections using copper (Cu) having a relatively low specific resistance have been utilized. A case is considered in which, while Cu interconnections in a memory cell portion are made as thin as possible, Cu interconnections in a peripheral circuit portion are made relatively thick. For example, in a case in which Cu interconnections are formed by use of an embedding method, the Cu interconnections are formed to have upper faces in a single plane, but to have lower faces at different levels. The thicknesses of the interconnection layers are appropriately adjusted as a result.

For example, there is disclosed a method of forming interconnections in a semiconductor device (refer to, for example, Japanese Patent Application Publication No. 2000-114259). In the method, a groove interconnection forming work (opening) is performed by etching an interlayer film that is laminated on tungsten (W) plugs formed in contact holes; thereafter, an interconnection metal made of aluminum (Al) or Cu is embedded in interconnection grooves formed through this groove interconnection forming work. The depths of the different interconnection grooves are varied due to a microloading effect during the groove interconnection forming work. The material of the plugs and the embedded material are not limited to W and Cu, respectively, but are different from each other in many cases.

According to the disclosed forming method, an insulating film having a wider opening width is etched more deeply than an insulating film having a narrower opening width, and thus an interconnection having a smaller cross-sectional area and an interconnection having a larger cross-sectional area can be formed. However, since the W plug remains scarcely etched, the interconnection having a larger cross-sectional area comes to have a shape in which the W plug intrudes deeply into the interconnection metal. If a W plug intrudes deeply into an interconnection metal, an embedding defect occurs in which a void and the like are formed in the interconnection metal on a side face of the W plug or in the vicinity of the side face. Additionally, there arises a problem that, because the interconnection metal on the upper face of the W plug is formed relatively thinly, and a part where a current density is high is generated as a result, the chance of occurrence of electromigration increases. When at least any one of the above-mentioned embedding defect and electromigration occurs, the interconnection resistance increases, and the performance of the semiconductor device is impeded.

BRIEF SUMMARY OF THE INVENTION

In one embodiment, a semiconductor memory device according to an aspect of the present invention includes: first and second conductors provided in a surface of a semiconductor substrate or at positions over and away from the semiconductor substrate, and having upper faces flush with each other; an insulating film formed so as to cover the upper faces of the first and second conductors, and having a uniform film thickness; a first conductor plug formed in the insulating film, and connected to the first conductor; a second conductor plug formed in the insulating film, having a lower height than the first conductor plug, and connected to the second conductor; a first interconnection layer having a lower end portion connected to an upper end portion of the first conductive plug, the first interconnection layer being embedded in the insulating film, and an upper face of the first interconnection layer being flush with the insulating layer; and a second interconnection layer having a lower end portion connected to an upper end portion of the second conductive plug, the second interconnection layer being embedded in the insulating film, and an upper face of the second interconnection layer being flush with the insulating film.

In another embodiment, a semiconductor memory device manufacturing method according to an aspect of the present invention includes:

forming a first insulating film on first and second conductors, the first and second conductors having upper faces flush with each other, the first and second conductors being formed, in a surface of a semiconductor substrate or over and away from the semiconductor substrate, and being formed respectively in first and second regions of the semiconductor substrate; etching the first insulating film to form through-holes that respectively communicate with the first and second conductors embedding third conductors in the through-holes; making surfaces of the third conductors flush with a surface of the first insulating film; etching the third conductor in the second region to reduce the height of the third conductor, forming a second insulating film on the third conductors and the first insulating film in the first and second regions; etching the second insulating film in the first region to expose the third conductor through a bottom face of the second insulating film; etching the first and second insulating films in the second region to expose the third conductor; forming a fourth conductor on the exposed first and second conductors and the first and second insulating films; and making the fourth conductor flush with the second insulating film.

In another embodiment, a semiconductor device manufacturing method according to an aspect of the present invention includes:

forming a first insulating film on first and second conductors, the first and second conductors having upper faces flush with each other, the first and second conductors being formed in a surface of a semiconductor substrate or over and away from the semiconductor substrate, and being formed on respectively in a first and second regions of the semiconductor substrate; etching the first insulating film to form a first through-hole that communicates with the first conductor and to form a second through-hole that communicates with the second conductor, the first and second through-holes having different widths; embedding third conductors in the through-holes; making surfaces of the third conductors flush with the first insulating film; forming a second insulating film on the third conductors and the first insulating film; forming a first opening in the first and second insulating films in the first region to expose the third conductors, and forming a second opening in the first and second insulating films in the second region, and a width of the first opening is smaller than that of the second opening, and a bottom of the second opening is lower than that of the first opening; etching the third conductor in the second region; forming a fourth conductor on the exposed third conductors and the first and second insulating films; and making the fourth conductor flush with the second insulating film.

BRIEF DESCRIPTION OF THE DRAWINGS

FIGS. 1A to 1C are cross-sectional views diagrammatically showing a structure of a semiconductor device according to a first embodiment of the present invention, in which: FIG. 1A is a cross-sectional view of a memory cell portion of a NAND-type flash EEPROM; FIG. 1B is a cross-sectional view of a peripheral circuit portion thereof, and FIG. 1C is a cross-sectional view schematically showing portions connected to metal plugs of the memory cell portion and the peripheral circuit portion.

DETAILED DESCRIPTION OF PREFERRED EMBODIMENTS OF THE INVENTION

Figure 1:
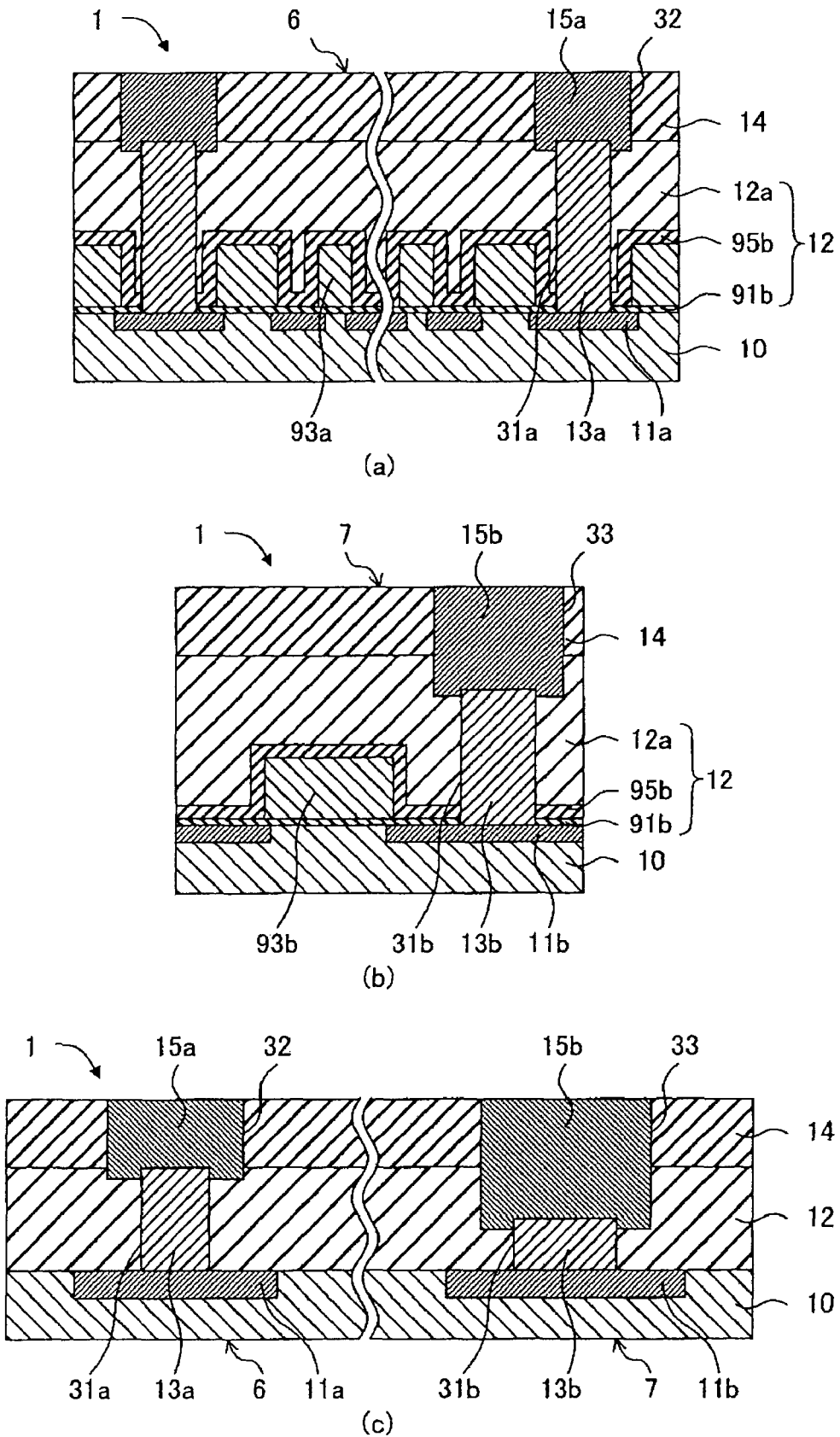
Figure 2:
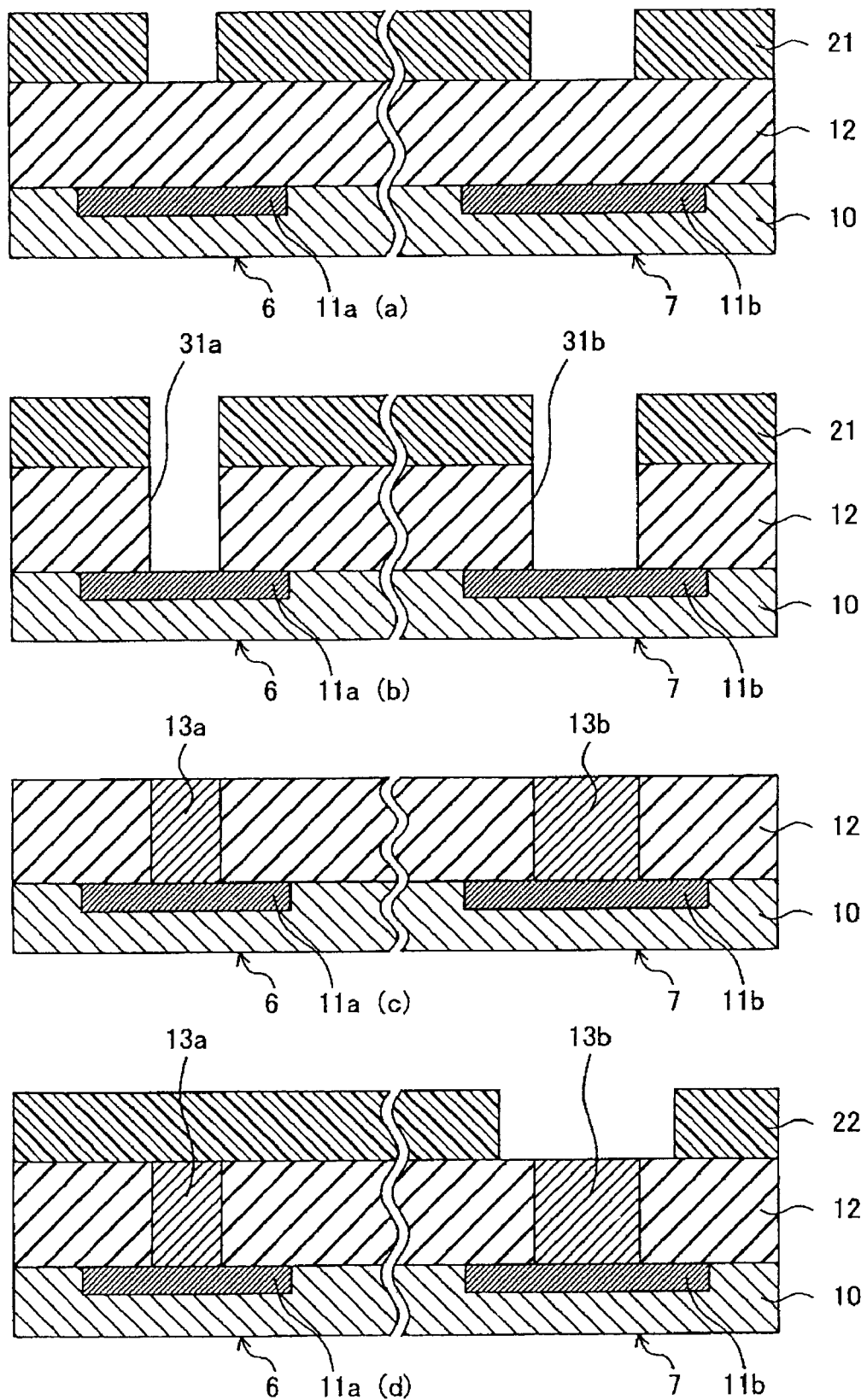
FIGS. 2A to 2D are cross-sectional structural views diagrammatically showing a part of a semiconductor device manufacturing method according to the first embodiment of the present invention in accordance with a sequence of steps therein.
Figure 3:
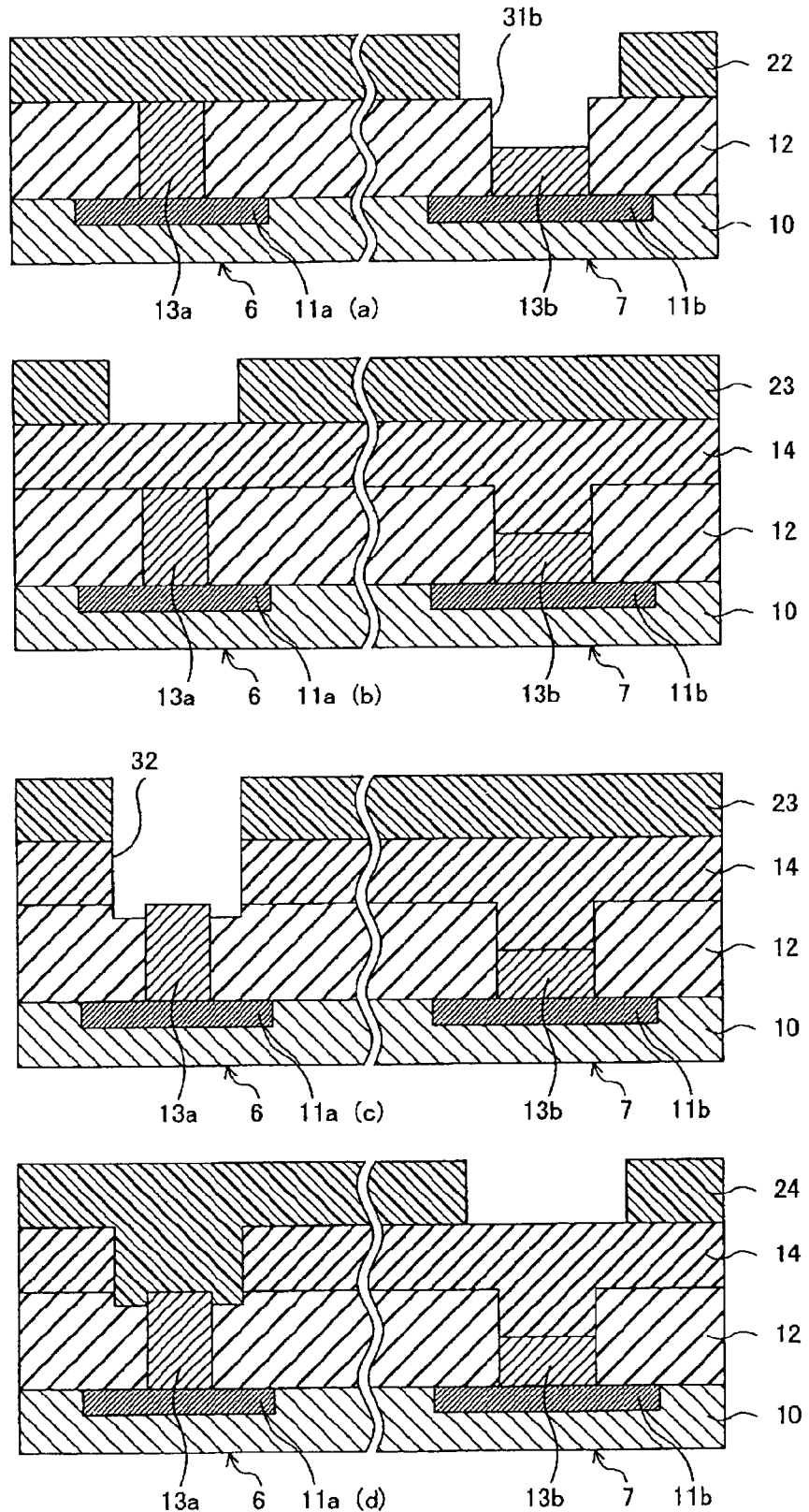
FIGS. 3A to 3D are cross-sectional structural views diagrammatically showing a part of the semiconductor device manufacturing method according to the first embodiment of the present invention in accordance with a sequence of steps therein, the part following the part shown in FIGS. 2A to 2D.

Embodiments of the present invention will be described below with reference to the drawings. Throughout the drawings, the same reference numerals refer to the same elements. In the following embodiments, note that a direction from the outside toward a surface of a semiconductor substrate is referred to as a direction "downward" or "to the lower side," and that a direction going away from the surface of the semiconductor substrate is referred to as a direction "upward" or "to the upper side."

Figure 4:
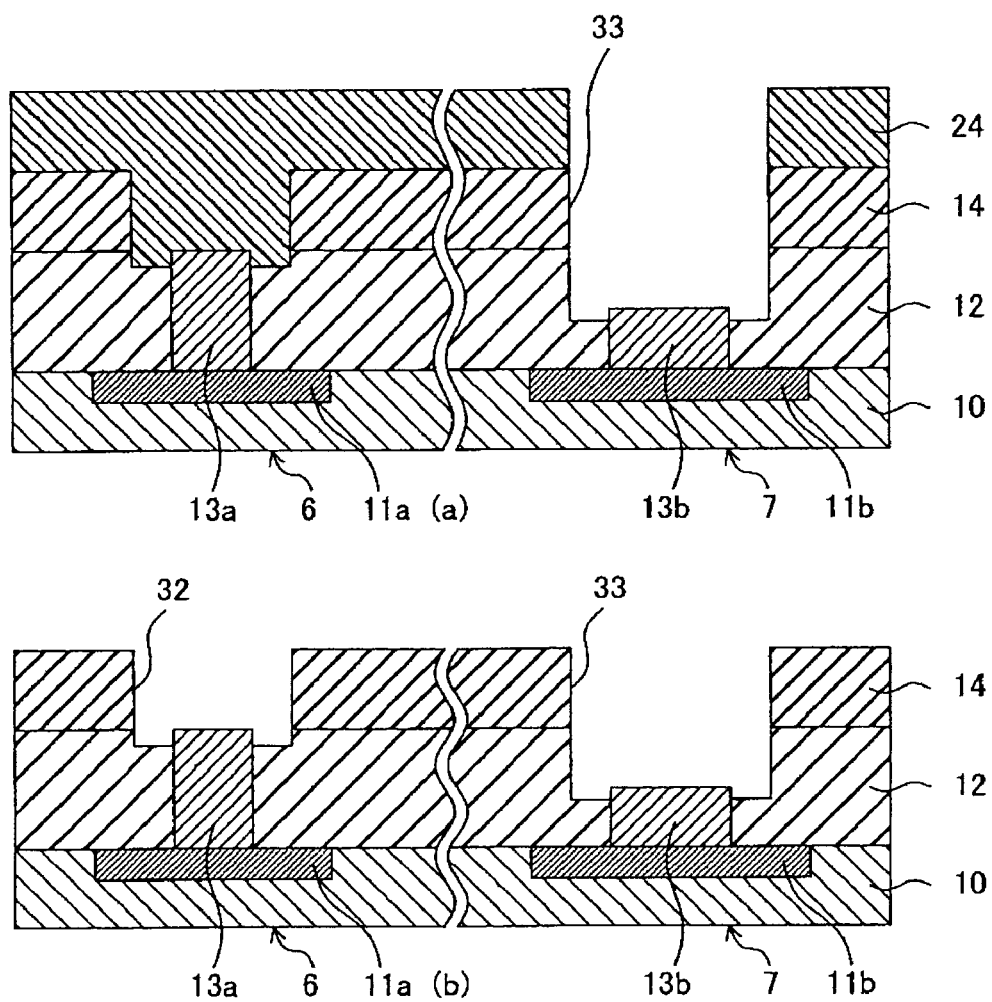
FIGS. 4A and 4B are cross-sectional structural views diagrammatically showing a part of the semiconductor device manufacturing method according to the first embodiment of the present invention in accordance with a sequence of steps therein, the part following the part shown in FIGS. 3A to 3D.
Figure 5:
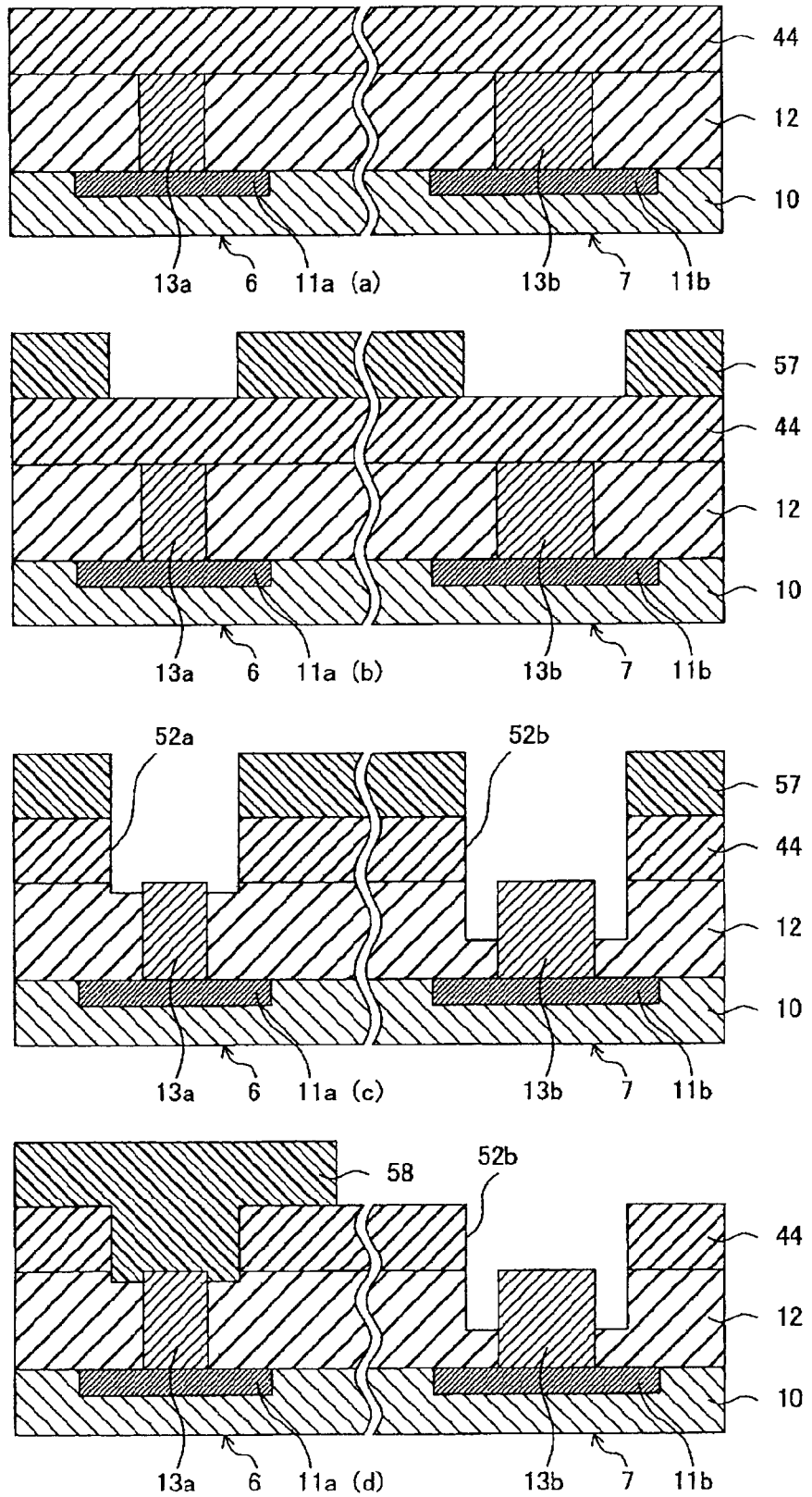
FIGS. 5A to 5D are cross-sectional structural views diagrammatically showing a part of a semiconductor device manufacturing method according to a second embodiment of the present invention in accordance with a sequence of steps therein.

A semiconductor device and a semiconductor device manufacturing method according to a first embodiment of the present invention will be described with reference to FIGS. 1A to 4B. FIGS. 1A to 1C are cross-sectional views diagrammatically showing a structure of the semiconductor device, in which: FIG. 1A is a cross-sectional view of a memory cell portion of a NAND-type flash electrically erasable and programmable read-only memory (EEPROM); FIG. 1B is a cross-sectional view of a peripheral circuit portion thereof; and FIG. 1C is a cross-sectional view schematically showing portions connected to metal plugs of the memory cell portion and the peripheral circuit portion. FIGS. 2A to 2D are cross-sectional structural views diagrammatically showing a part of the semiconductor device manufacturing method in accordance with a sequence of steps therein. FIGS. 3A to 3D are cross-sectional structural views diagrammatically showing a part of the semiconductor device manufacturing method in accordance with a sequence of steps therein, following the part shown in FIGS. 2A to 2D. FIGS. 4A and 4B are cross-sectional structural views diagrammatically showing a part of the semiconductor device manufacturing method in accordance with a sequence of steps therein, following the part shown in FIGS. 3A to 3D.

As shown in FIGS. 1A to 1C, a semiconductor device 1 includes: an impurity diffusion layer 11a in a memory cell portion 6 and an impurity diffusion layer 11b in a peripheral circuit portion 7 that are respectively first and second impurity diffusion layers provided in a surface of a semiconductor substrate 10, and having upper faces substantially flush with each other; insulating films 12 and 14 that are formed so as to cover the upper faces of the impurity diffusion layers 11a and 11b, and have substantially uniform film thicknesses; a metal plug 13a that is a first conductor plug formed in the insulating films 12 and 14, and connected to the impurity diffusion layer 11a; a metal plug 13b that is a second conductor plug formed in the insulating film 12, formed to have a lower height than the metal plug 13a, and connected to the impurity diffusion layer 11b; a metal interconnection 15a that is a first interconnection layer connected to an upper end portion of the metal plug 13a and having an upper face embedded so as to be flush with the insulating film 14; and a metal interconnection 15b that is a second interconnection layer connected to an upper end portion of the metal plug 13b and having an upper face embedded so as to be flush with the insulating film 14.

The semiconductor substrate 10 is, for example, a silicon substrate. The semiconductor substrate 10 includes: the memory cell portion 6 (refer to FIG. 1A) in which a transistor is formed through a process such as a lithographic process with a minimum line width; and the peripheral circuit portion 7 (refer to FIG. 1B) formed of such elements as a control circuit in which a transistor for driving the memory cell portion 6 is formed.

In the surface of the semiconductor substrate 10, for example, there are formed, in the memory cell portion 6, the impurity diffusion layer 11a as a diffusion region of a transistor and the like, and, in the peripheral circuit portion 7, the impurity diffusion layer 11b as a diffusion region of a transistor and the like. Note that the impurity diffusion layers 11a and 11b may be interconnections in upper portions of the memory cell portion 6 and the peripheral circuit portion 7, that is, the impurity diffusion layers 11a and 11b may be provided at positions over and away from the surface of the semiconductor substrate 10.

The insulating film 12 is laminated on the semiconductor substrate 10, and the insulating film 14 is laminated on the insulating film 12. As shown in FIGS. 1A and 1B, as the insulating film 12, for example, a gate insulating film 91a or 91b, a silicon nitride film 95a or 95b, and a silicon oxide film 12a are laminated in that order from the semiconductor device 10. Each of the gate insulating films 91a and 91b is made of a silicon oxide ($SiO_2$) film, a silicon oxynitride (SiON) film, or the like. The silicon oxide film 12a can be replaced by a carbon-containing silicon oxide (SiOC) film, a silicon oxynitride (SiON) film, or the like. The insulating film 14 can be selected from a silicon oxide film, a carbon-containing silicon oxide (SiOC) film, a silicon oxynitride (SiON) film, and the like.

Additionally, gate electrodes 93a and 93b of the transistors are arranged on the gate insulating films 91a and 91b, respectively, so as to be covered by the silicon nitride films 95a and 95b. As the gate electrode 93a of the memory cell portion 6, for example, a polysilicon film, an ONO film formed of a silicon oxide film, a silicon nitride film and a silicon oxide film, another polysilicon film, a tungsten silicide film, and a silicon oxide film are laminated in that order from the gate insulating film 91a although illustration thereof is omitted. The gate electrode 93b of the peripheral circuit portion 7, for example, may be a configuration excluding the ONO film from the gate electrode 93a of the memory cell portion 6.

The following description will be given by use of the schematically illustrated insulating film 12 as shown in FIG. 1C. In the memory cell portion 6, the metal plug 13a connected to the impurity diffusion layer 11a, and the metal interconnection 15a connected to the upper end portion of the metal plug 13a are formed so as to penetrate the insulating film 14 and an upper part of the insulating film 12. The upper face of the metal interconnection 15a is substantially flush with the upper face of the insulating film 14. The metal plug 13a has a configuration including: a tantalum (Ta) film that is a diffusion-preventing metal film (barrier metal) abutting an opening 31a provided in the insulating film 12; and a W film provided in a central portion of the opening 31a and abutting on this barrier metal, although illustration thereof is omitted. The metal interconnection 15a has a configuration including: a Ta film that is a barrier metal abutting the metal plug 13a and abutting an opening 32 provided in the insulating films 12 and 14; and a Cu film provided in a central portion of the opening 32 and abutting on this barrier metal, although illustration thereof is omitted. Note that, while the barrier metal of the metal plug 13a may be titanium nitride (TiN), Ta, or the like, the barrier metal of the metal interconnection 15a may be titanium (Ti), TiN, tantalum nitride (TaN), Ta, or the like.

In the peripheral circuit portion 7, the impurity diffusion layer 11b, the metal plug 13b and the metal interconnection 15b are arranged in the same manner as, and have the same levels as, the comparable elements in the memory cell portion 6. However, a distance of a top of the metal plug 13b from the impurity diffusion layer 11b may be lower than that of the metal plug 13a. And the width of the metal plug 13b is wider than that of the metal plug 13a Additionally, the metal interconnection 15b is formed thicker (so that a distance of the top of the metal interconnection 15b from the impurity diffusion layer 11b is higher) and wider than the metal interconnection 15a. In other words, while the metal plug 13a of the memory cell portion 6 has a height substantially equal to the film thickness of the insulating film 12, the metal plug 13b of the peripheral circuit portion 7 has a height less than that of the film thickness of the insulating film 12.

Although illustration thereof is omitted, the metal interconnection 15a of the memory cell portion 6 has a height set within an acceptable range so as to reduce the capacitance between the metal interconnection 15a and a metal interconnection adjacent thereto. The insulating film 14 is formed in a thickness substantially matching the height of the metal interconnection 15a. The opening 32 is formed so as to slightly intrude into an upper portion of the insulating film 12, that is, so as to have a bottom face al; a position slightly lower than an upper face of the metal plug 13a.

For the metal interconnection 15b in the peripheral circuit portion 7, reducing resistance of the interconnection is beneficially important. The cross-sectional area of the metal interconnection 15b is formed larger than the cross-sectional area of the metal interconnection 15a. An opening 33 is formed so as to penetrate the insulating film 14, reach a substantially central portion of the insulating film 12, and have a bottom face at a position slightly lower than an upper face of the metal plug 13b.

Next, the manufacturing method of the semiconductor device 1 will be described. As shown in FIG. 2A, the semiconductor device 1 includes the memory cell portion 6 and the peripheral circuit portion 7 that are first and second regions, respectively. The insulating film 12 is formed on a surface of the semiconductor substrate 10, the surface having the impurity diffusion layer 11a of the memory cell portion 6 and the impurity diffusion layer 11b of the peripheral circuit portion 7 formed therein. The insulating film 12 is, for example, a boron phosphorous silicate glass (BPSG) or a film formed by use of tetraethoxy silane (TEOS) or the like according to a dual frequency-plasma enhanced chemical vapor deposition (DF-PECVD) method.

Thereafter, a patterned resist 21 is formed for forming openings respectively communicating with the impurity diffusion layers 11a and 11b. To reduce the interconnection resistance, the pattern for the opening to the impurity diffusion layer 11b has a wider width than the pattern for the opening to the impurity diffusion layer 11a.

As shown in FIG. 2B, the insulating film 12 is etched by a reactive ion etching (RIE) method or the like with the resist 21 as a mask, whereby the opening 31a and an opening 31b are formed which are respectively for forming through-holes having bottom portions through which the impurity diffusion layers 11a and 11b are exposed. Each of wall faces of the openings 31a and 31b in the insulating film 12 is substantially perpendicular to the surface of the semiconductor substrate 10, or has a tapered shape having a narrower width toward the bottom portion. Note that, for the purpose of simplification, the wall faces of the openings are illustrated, in the drawings, as being substantially perpendicular to the surface of the semiconductor substrate 10 in this embodiment, and the same is applied to the other embodiments as well.

As shown in FIG. 2C, after the resist 21 is removed, a metal for forming the metal plugs 13a and 13b, which are third conductors, is formed by a chemical vapor deposition (CVD) method or the like so as to be embedded in the openings 31a and 31b. Thereafter, the resulting surface is planarized by a chemical mechanical polishing (CMP) method or the like with the insulating film 12 serving as a stopper. Thus, a planarized surface is formed in which the upper faces of the metal plugs 13a and 13b and of the insulating film 12 are flush with one another. Note that each of the metal plugs 13a and 13b has a structure in which a Ta thin film as a barrier metal and a W film are sequentially laminated.

As shown in FIG. 2D, a resist pattern 22 is formed on the planarized surface formed of the metal plugs 13a and 13b and the insulating film 12 so that the metal plug 13b may be formed to have a lower height.

As shown in FIG. 3A, the metal plug 13b is selectively etched from above by the RIE method or the like with the resist pattern 22 as a mask. The level of the upper face of the metal plug 13b is lowered almost to the center of the film thickness of the insulating film 12 until the level becomes suitable for the film thickness of a metal interconnection that is arranged on the metal plug 13b to the end, and also suitable for the positional relation in the metal interconnections. Since the level of the upper face of the metal plug 13b is lowered, an upper portion of the wall face forming the opening 31b is exposed.

As shown in FIG. 3B, after the resist pattern 22 is removed, the insulating film 14 is formed so as to cover the upper faces of the metal plugs 13a and 13b and the upper face of the insulating film 12. Thereafter, a resist pattern 23 is formed for forming an opening for a metal interconnection connected to the metal plug 13a. The insulating film 14 is formed in a film thickness conforming to the film thickness of the metal interconnection connected to the metal plug 13a.

As shown in FIG. 3C, the opening 32 for the metal interconnection connected to the metal plug 13a is formed by the RIE method or the like with the resist 23 serving as a mask. The opening 32 has a structure in which the opening 32 penetrates the insulating film 14 and an upper end portion of the insulating film 12 is etched so that the upper end portion of the metal plug 13a may be exposed through a bottom portion of the opening 32.

As shown in FIG. 3D, after the resist pattern 23 is removed, a resist pattern 24 is formed on the metal plug 13a and the insulating films 12 and 14. This process is performed to form an opening for a metal interconnection connected to the metal plug 13b.

As shown in FIG. 4A, the opening 33 for the metal interconnection connected to the metal plug 13b is formed by the RIE method or the like with the resist 24 as a mask. The opening 33 has a structure in which the opening 33 penetrates the insulating film 14 and the insulating film 12 is etched and comes to a position slightly lower than the upper face of the metal plug 13b so that the upper end portion of the metal plug 13b may be exposed through a bottom portion of the opening 33. Note that, in formation of the openings 32 and 33, the openings 33 and 32 can be formed firstly and later, respectively, i.e., in an order reverse to the above described order.

As shown in FIG. 4B, when the resist 24 is removed, the upper face of the metal plug 13a is exposed through the bottom portion of the opening 32, and the upper face of the metal plug 13b is exposed through the bottom portion of the opening 33. Thereafter, a metal for forming the metal interconnections 15a and 15b are formed by the CVD method or the like so as to cover the openings 32 and 33, and the upper face of the insulating film 14. After that, the resulting surface of the metal interconnections 15a and 15b is planarized by the CMP method or the like. Thus, a planarized surface formed of the metal interconnections 15a and 15b and the insulating film 14 is formed (refer to FIG. 1C). Note that each of the metal interconnections 15a and 15b has a structure in which a Ta thin film to serve as a barrier metal and a Cu film are sequentially laminated. Note that the Cu film can also be formed on a seed film made of, for example, Cu by a plating method after the seed film is formed on the barrier metal.

A process such as a known upper interconnection process is performed on the planarized surface formed of the metal interconnections 15a and 15b and the insulating film 14 to thereby complete the semiconductor device 1.

As has been described above, the semiconductor device 1 includes: the relatively higher metal plug 13a connected to the impurity diffusion layer 11a; and the relatively thin metal interconnection 15a connected to the upper end portion of the metal plug 13a, in the memory cell portion 6. The semiconductor device 1 further includes: the relatively lower metal plug 13b connected to the impurity diffusion layer 11b that is substantially flush with the impurity diffusion layer 11a; and the relatively thick metal interconnection 15b connected to the upper end portion of the metal plug 13b in the peripheral circuit portion 7. The upper faces of the metal interconnections 15a and 15b are substantially flush with each other.

As a result, the semiconductor device 1 allows the capacitances between adjacent ones of the metal interconnections 15a in the memory cell portion 6 to be relatively reduced. To put it differently, it is possible to shrink the memory cell portion 6. Meanwhile, the resistance of the metal interconnection 15b in the peripheral circuit portion 7 can be relatively reduced.

Additionally, in the metal interconnection 15b in the peripheral circuit portion 7 through which a large current flows, the semiconductor device 1 can secure a large distance between the upper face of the metal interconnection 15b and the upper end portion of the metal plug 13b to the extent that the distance is almost as large as the film thickness of the metal interconnection 15b. Consequently, a current density generated in an upper portion of the metal plug 13b can be suppressed to be lowered. As a result, occurrence of electromigration can be suppressed, whereby an increase in the resistance can be suppressed, and furthermore, disconnection can be suppressed.

Additionally, in the semiconductor device 1, the upper end portions of the metal plugs 13a and 13b are not deeply intruded into the metal interconnections 15a and 15b. As a result, when the metal interconnections 15a and 15b are formed by embedment thereof, embedding defects occurring on side faces of the metal plugs 13a and 13b and in the vicinities of the side faces thereof can be decreased in number.

Additionally, in the semiconductor device 1, the metal plugs 13a and 13b are formed in a process different from a process for forming the metal interconnections 15a and 15b. Consequently, the metal plugs 13a and 13b in favorable configurations can be formed by embedment even in openings each having a large aspect ratio (ratio of the depth (height) of the opening to the width thereof). As a result, increases in the resistance of the metal plugs 13a and 13b can be prevented, and the electric characteristics can be stable.

Figure 6:
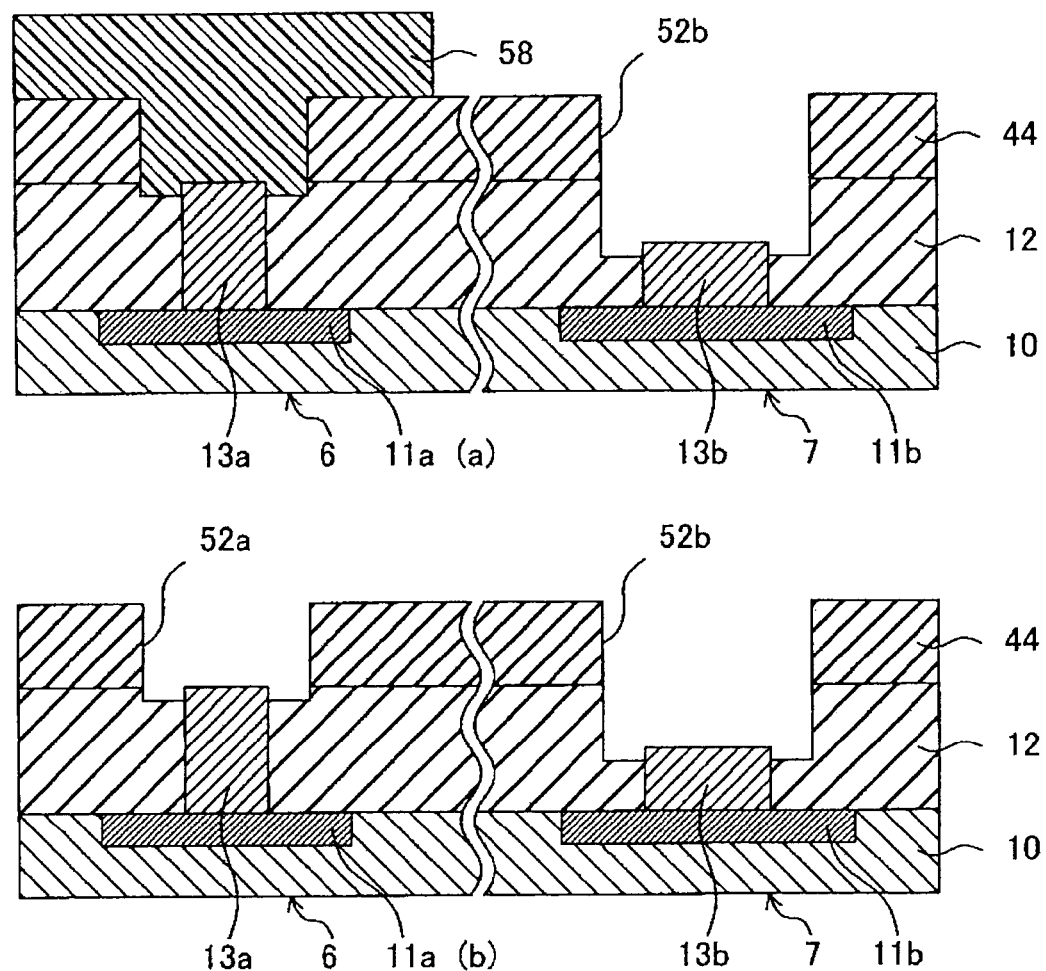
FIGS. 6A and 6B are cross-sectional structural views diagrammatically showing a part of the semiconductor device manufacturing method according to the second embodiment of the present invention in accordance with a sequence of steps therein, the part following the part shown in FIGS. 5A to 5D.

A semiconductor device and a semiconductor device manufacturing method according to a second embodiment of the present invention will be described with reference to FIGS. 5A to 6B. FIGS. 5A to 5D are cross-sectional structural views diagrammatically showing a part of the semiconductor device manufacturing method in accordance with a sequence of steps therein. FIGS. 6A and 6B are cross-sectional structural views diagrammatically showing a part of the semiconductor device manufacturing method in accordance with a sequence of steps therein, following the part shown in FIGS. 5A to 5D. The semiconductor device in this embodiment differs from the semiconductor device 1 in the first embodiment in that openings for metal interconnections in a memory cell portion and a peripheral circuit portion are concurrently formed. Note that elements common with the first embodiment are designated by the same reference numerals, and description thereof will be omitted.

The semiconductor device in this embodiment (of which illustration is omitted) has the same configuration as the semiconductor device 1 of the first embodiment. Note that some of the elements different in manufacturing sequence are designated by different reference numerals.

Next, the semiconductor device manufacturing method will be described. As shown in FIG. 5A, after the completion of the same processes as those of the first embodiment shown in FIGS. 2A to 2C, an insulating film 44 is formed on the metal plugs 13a and 13b and the insulating film 12 which have been planarized.

As shown in FIG. 5B, a resist pattern 57 is formed on the insulating film 44 for forming openings for metal interconnections respectively connected to the metal plugs 13a and 13b.

As shown in FIG. 5C, a narrower-width opening 52a for the metal interconnection connected to the metal plug 13a, and a wider-width opening 52b for the metal interconnection connected to the metal plug 13b are concurrently formed by the RIE method with the resist pattern 57 as a mask. When an upper end portion of the metal plug 13a becomes exposed in the narrower-width opening 52a, the wider-width opening 52b is in a more deeply etched state, and the metal plug 13b projects to a larger extent from a bottom portion of the wide-width opening 52b. In other words, the bottom portion of the wide-width opening 52b becomes deeper than that of the narrow-width opening 52a. Note that the micro-loading effect is utilized in the etching applied to a narrow-width region so that the etching progresses more slowly than the etching applied to a wide-width region. Here, a relationship among an opening width, an etching speed, an etching condition, and the like is previously obtained, and the depths of the openings for the metal interconnections relative to required opening widths can be achieved by etching application for a certain time period, i.e., by common etching application.

As shown in FIG. 5D, after the resist pattern 57 is removed, a resist pattern 58 is formed on the metal plug 13a and the insulating films 12 and 44 so that the metal plug 13b may be exposed.

As shown in FIG. 6A, the exposed metal plug 13a is selectively etched by the RIE method or the like with the resist pattern 58 as a mask, whereby an upper face of the metal plug 13b is lowered to a level slightly higher than the bottom portion of the opening 52b.

As shown in FIG. 6B, when the resist 58 is removed, the same structure as the structure of the first embodiment shown in FIG. 4B is formed. Thereafter, the same processes as in the first embodiment are performed, and the same semiconductor device as the semiconductor device 1 of the first embodiment is completed.

As has been described above, the semiconductor device of this embodiment has the same structure as the semiconductor device 1, and has the same effects as the semiconductor device 1. Besides, since openings for metal interconnections can be concurrently formed in the memory cell portion 6 and the peripheral circuit portion 7, manufacturing processes can be made less time-consuming.

Figure 7:
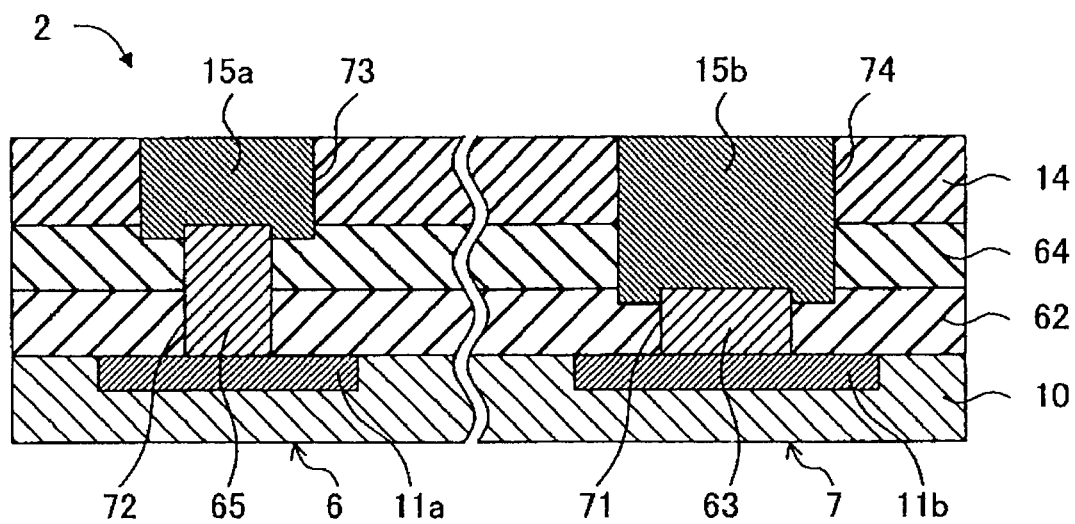
FIG. 7 is a cross-sectional view diagrammatically showing a structure of a semiconductor device according to a third embodiment of the present invention.
Figure 8:
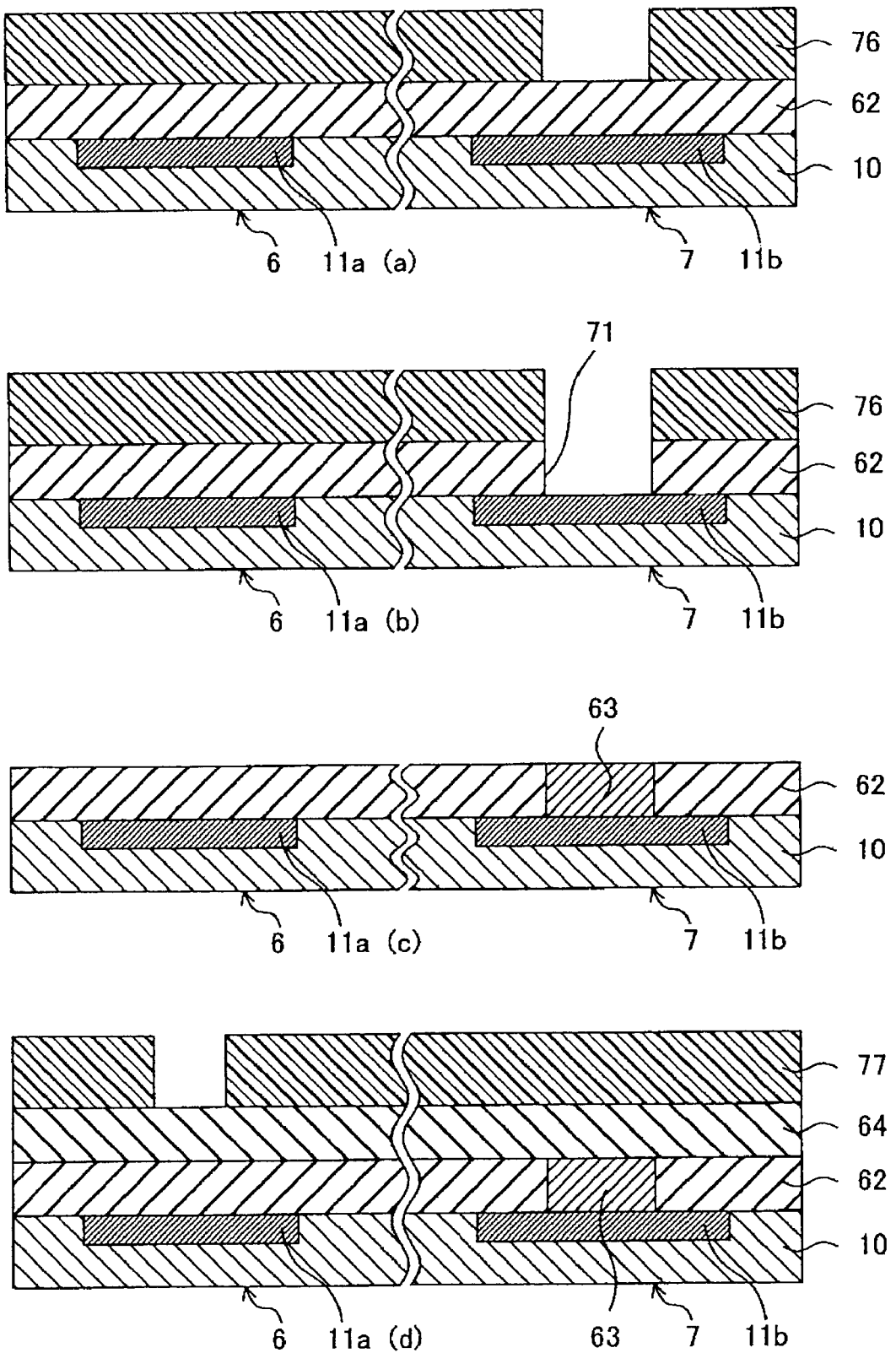
FIGS. 8A to 8D are cross-sectional structural views diagrammatically showing a part of a semiconductor device manufacturing method according to the third embodiment of the present invention in accordance with a sequence of steps therein.
Figure 9:
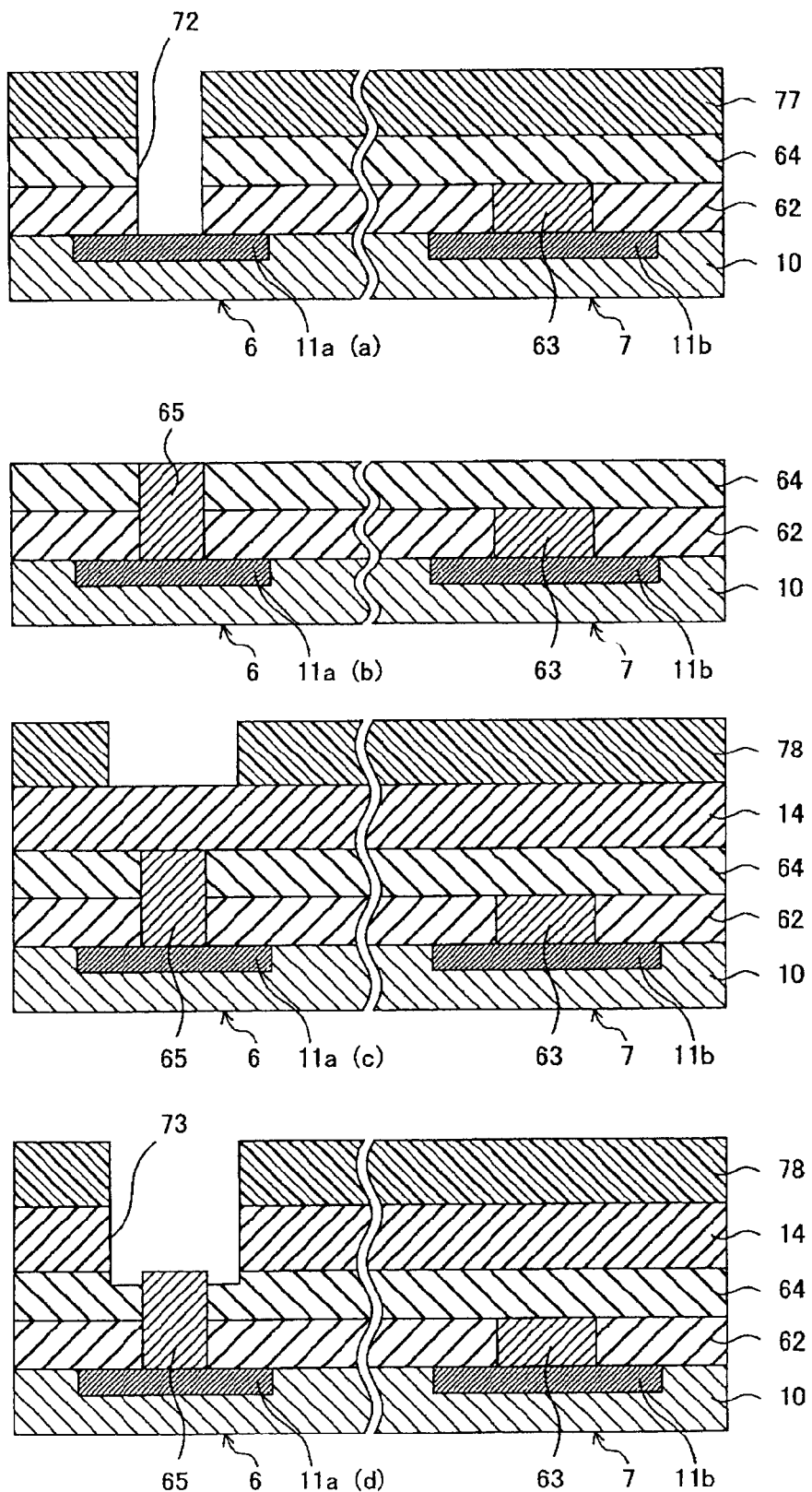
FIGS. 9A to 9D are cross-sectional structural views diagrammatically showing a part of the semiconductor device manufacturing method according to the third embodiment of the present invention in accordance with a sequence of steps therein, the part following the part shown in FIGS. 8A to 8D.
Figure 10:
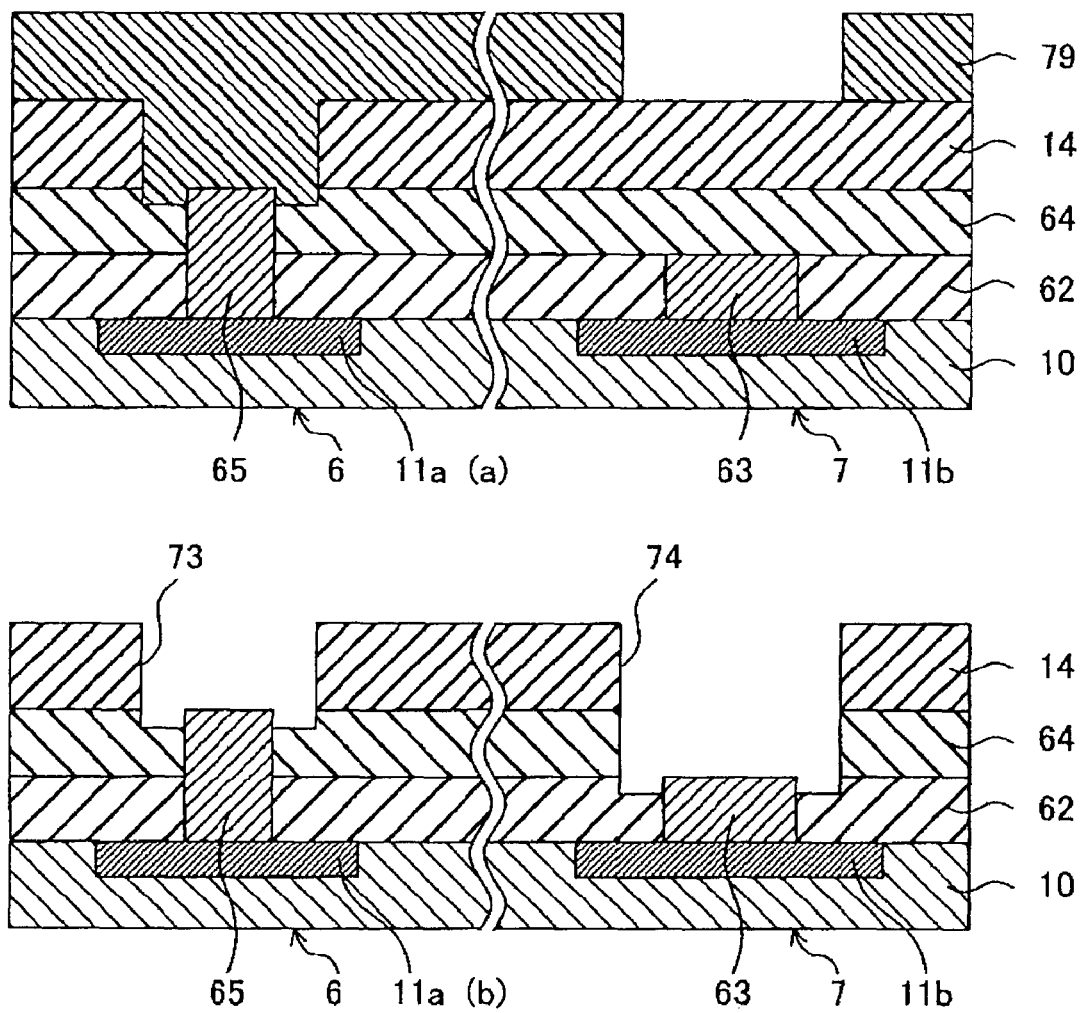
FIGS. 10A and 10B are cross-sectional structural views diagrammatically showing a part of the semiconductor device manufacturing method according to the third embodiment of the present invention in accordance with a sequence of steps, the part following the part shown in FIGS. 9A to 9D.
Figure 11:
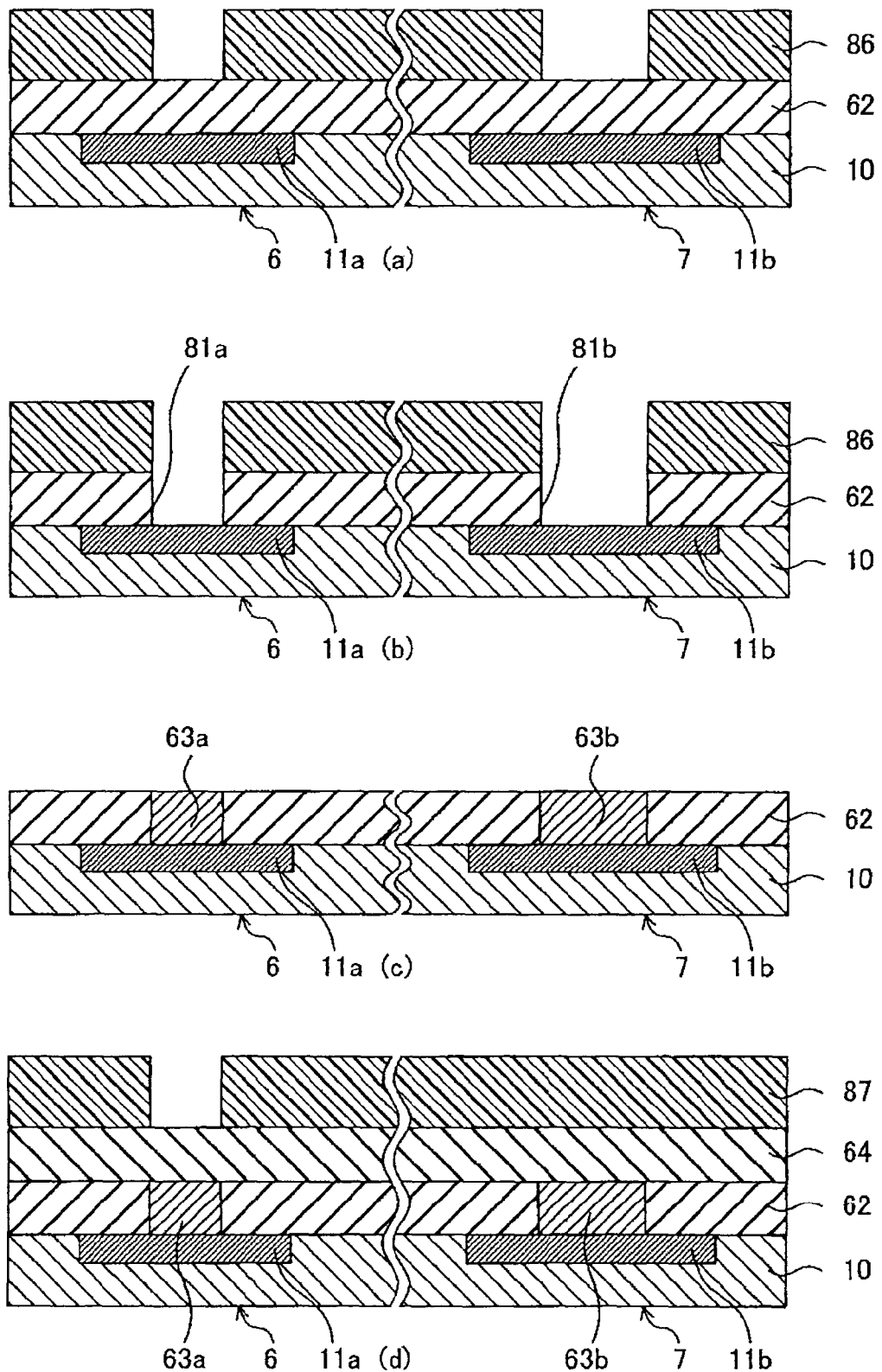
FIGS. 11A to 11D are cross-sectional structural views diagrammatically showing a part of a semiconductor device manufacturing method according to a fourth embodiment of the present invention in accordance with a sequence of steps therein.

A semiconductor device and a semiconductor device manufacturing method according to a third embodiment of the present invention will be described with reference to FIG. 7 to FIG. 10B. FIG. 7 is a cross-sectional view diagrammatically showing a structure of the semiconductor device. FIGS. 8A to 8D are cross-sectional structural views diagrammatically showing a part of the semiconductor device manufacturing method in accordance with a sequence of steps therein. FIGS. 9A to 9D are cross-sectional structural views diagrammatically showing a part of the semiconductor device manufacturing method in accordance with a sequence of steps therein, following the part shown in FIGS. 8A to 8D. FIGS. 10A and 10B are cross-sectional structural views diagrammatically showing a part of the semiconductor device manufacturing method in accordance with a sequence of steps, following the part shown in FIGS. 9A to 9D. The semiconductor device in this embodiment differs from the semiconductor device 1 of the first embodiment in that another insulating film is additionally laminated. Note that elements common with the first and second embodiments are designated by the same reference numerals, and description thereof will be omitted.

As shown in FIG. 7, a semiconductor device 2 has a configuration in which the insulating film 12 of the semiconductor device 1 of the first embodiment is replaced by two layers that are a lower-layer insulating film 62 and an upper-layer insulating film 64. Additionally, in the semiconductor device 2, a metal plug 62 corresponding to the metal plug 13a of the semiconductor device 1 of the first embodiment has an upper face flush with an upper face of the upper-layer insulating film 64. Moreover, a metal plug 63 corresponding to the metal plug 13b of the semiconductor device 1 of the first embodiment has an upper face flush with an upper face of the lower-layer insulating film 62. Except for those points, the semiconductor device 2 has the same configuration as the semiconductor device 1 of the first embodiment.

Next, the manufacturing method of the semiconductor device 2 will be described. As shown in FIG. 8A, the semiconductor device 2 includes the memory cell portion 6 and the peripheral circuit portion 7. The insulating film 62 is formed on a surface of the semiconductor substrate 10, the surface having the impurity diffusion layer 11a of the memory cell portion 6 and the impurity diffusion layer 11b of the peripheral circuit portion 7 formed therein. The insulating film 62 is the same film as the insulating film 12 of the first embodiment except for being formed in a thinner film thickness than the insulating film 12. Thereafter, a resist pattern 76 is formed on the insulating film 62 for forming an opening communicating with the impurity diffusion layer 11b.

As shown in FIG. 8B, the insulating film 62 is etched by the RIE method or the like with the resist pattern 76 as a mask, whereby an opening 71 is formed which is for forming a through-hole having a bottom portion through which the impurity diffusion layer 11b is exposed.

As shown in FIG. 8C, after the resist 76 is removed, a metal for forming the metal plug 63 is formed by the CVD method or the like so as to be embedded in the opening 71. Thereafter, the resulting surface is planarized by the CMP method or the like, a planarized surface is formed in which upper faces of the metal plug 63 and the insulating film 62 are flush with each other. The metal plug 63 is made of the same material as the metal plugs 13a and 13b of the first embodiment.

As shown in FIG. 8D, the insulating film 64 is formed on the planarized surface formed of the metal plug 63 and the insulating film 62, and then, a resist pattern 77 is formed on the insulating film 64. This process is performed for forming an opening communicating with the impurity diffusion layer 11a. The film thickness of the laminated insulating films 62 and 64 can be, for example, the same as the film thickness of the insulating film 12 of the first embodiment.

As shown in FIG. 9A, the insulating films 64 and 62 are etched by the RIE method or the like with the resist pattern 77 as a mask, whereby an opening 72 is formed which is exposed the impurity diffusion layer 11a.

As shown in FIG. 9B, after the resist 77 is removed, a metal for forming the metal plug 65 is formed by the CVD method or the like so as to be embedded in the opening 72. Thereafter, the resulting surface of the metal is planarized by the CMP method or the like. Thus, a planarized surface is formed in which upper faces of the metal plug 65 and the insulating film 64 are flush with each other. The metal plug 63 is made of the same material as the metal plugs 13a and 13b of the first embodiment.

As shown in FIG. 9C, the insulating film 14 is formed so as to cover the upper faces of the metal plug 65 and the insulating film 64. Thereafter, a patterned resist 78 is formed with an opening for a metal interconnection connected to the metal plug 65. The insulating film 14 is formed in a film thickness conforming to the film thickness of the metal interconnection connected to the metal plug 65.

As shown in FIG. 9D, an opening 73 for the metal interconnection connected to the metal plug 65 is formed by the RIE method or the like with the resist 78 as a mask. The opening 73 penetrates the insulating film 14 and an upper end portion of the insulating film 64 is etched so that an upper end portion of the metal plug 65 may be exposed through a bottom portion of the opening 73.

As shown in FIG. 10A, after the resist pattern 78 is removed, a resist pattern 79 is formed on the metal plug 65 and the insulating films 64 and 14. This process is performed for forming an opening for a metal interconnection connected to the metal plug 63.

As shown in FIG. 10B, an opening 74 for the metal interconnection connected to the metal plug 63 is formed by the RIE method or the like with the resist 79 as a mask. The opening 74 penetrates the insulating films 14 and 64 and the insulating film 64 is etched and comes to a position slightly lower than the upper face of the metal plug 63 so that an upper end portion of the metal plug 63 may be exposed through a bottom portion of the opening 74. Note that, in formation of the openings 73 and 74, the openings 73 and 74 can be formed firstly and later, respectively, i.e., in an order reverse to the above described order. Thereafter, when the resist 79 is removed, the upper end portion of the metal plug 65 is exposed through the bottom portion of the opening 73, and the upper end portion of the metal plug 63 is exposed through the bottom portion of the opening 74.

Thereafter, the semiconductor device 2 is completed as in the case of the semiconductor device 1 of the first embodiment (refer to FIG. 7). The semiconductor device 2 has substantially the same structure as the semiconductor device 1 even with a difference between the semiconductor devices 1 and 2 that, while the semiconductor device 1 has a two-layer structure of the insulating films 12 and 14, the semiconductor device 2 has a three-layer structure of the insulating films 62, 64 and 14.

As a result, the semiconductor device 2 has the same effects as the semiconductor device 1 of the first embodiment. In addition, the height of the metal plug 63 can be more accurately formed than the corresponding metal plug of semiconductor device 1 since lowering the height of the metal plug by an etching method, as with the semiconductor device 1, is unnecessary.

Figure 12:
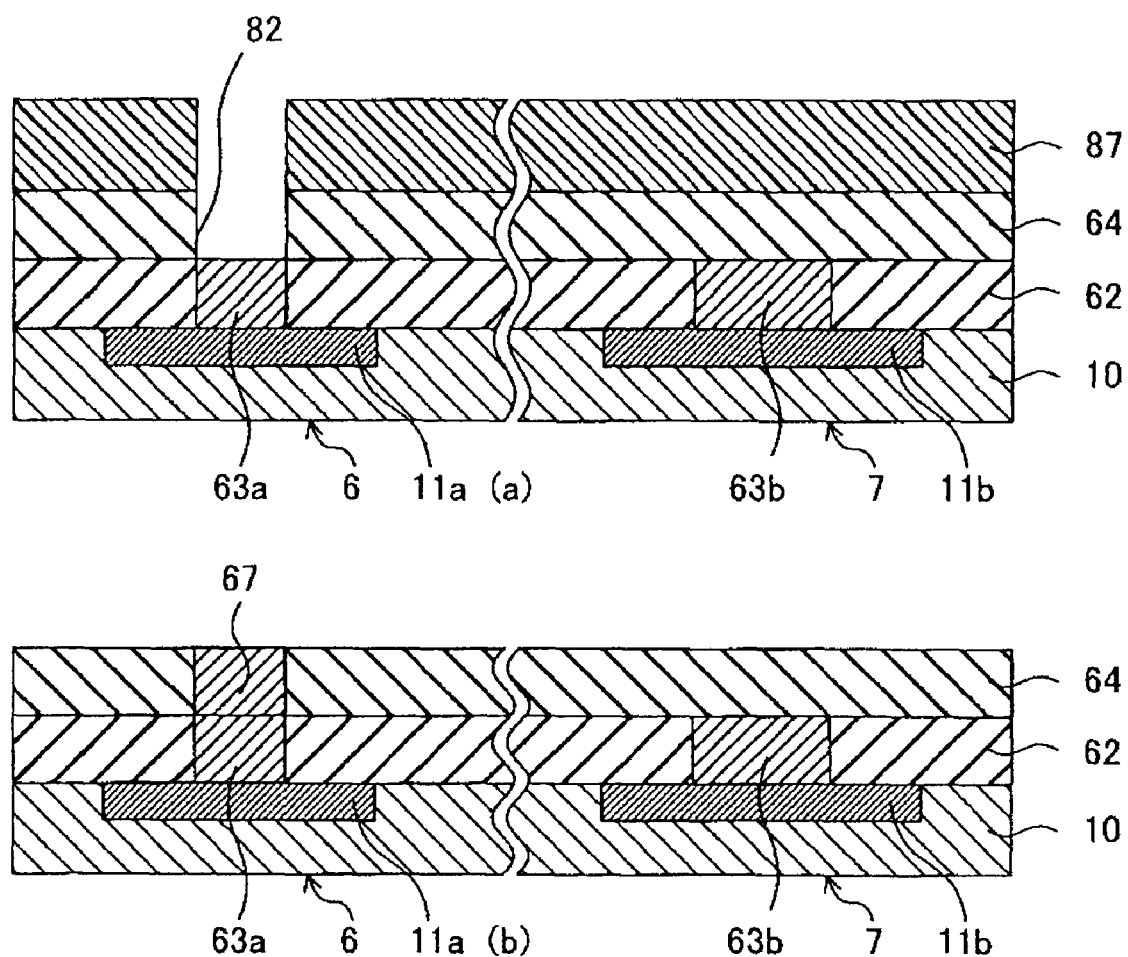
FIGS. 12A and 12B are cross-sectional structural views diagrammatically showing a part of the semiconductor device manufacturing method according to the fourth embodiment of the present invention in accordance with a sequence of steps therein, the part following the part shown in FIGS. 11A to 11D.

A semiconductor device and a semiconductor device manufacturing method according to a fourth embodiment of the present invention will be described with reference to FIGS. 11A to 12B. FIGS. 11A to 11D are cross-sectional structural views diagrammatically showing a part of the semiconductor device manufacturing method in accordance with a sequence of steps therein. FIGS. 12A and 12B are cross-sectional structural views diagrammatically showing a part of the semiconductor device manufacturing method in accordance with a sequence of steps therein, the part following the part shown in FIGS. 11A to 11D. The semiconductor device in this embodiment differs from the semiconductor device 2 of the third embodiment in that a higher metal plug is formed by laminating low metal plugs. Note that elements common with the first, second and third embodiments are designated by the same reference numerals, and description thereof will be omitted.

The semiconductor device in this embodiment (of which illustration is omitted) has the same configuration as the semiconductor device 2 of the third embodiment. Note that some of the elements different in manufacturing sequence and parts different in material are designated by different reference-numerals.

Next, the semiconductor device manufacturing method will be described. As shown in FIG. 11A, the semiconductor device includes the memory cell portion 6 and the peripheral circuit portion 7 that are first and second regions, respectively. The insulating film 62 is formed on a surface of the semiconductor substrate 10, the surface having the impurity diffusion layer 11a of the memory cell portion 6 and the impurity diffusion layer 11b of the peripheral circuit portion 7 formed therein. Thereafter, a resist pattern 86 is formed on the insulating film 62 for forming openings respectively communicating with the impurity diffusion layers 11a and 11b. To reduce the interconnection resistance, the pattern for the opening communicating with the impurity diffusion region 11b has a wider width than the pattern for the opening communicating with the impurity diffusion region 11a.

As shown in FIG. 11B, the insulating film 62 is etched by the RIE method or the like with the resist 86 as a mask, whereby openings 81a and 81b are formed which are respectively for forming through-holes having bottom portions through which the impurity diffusion layers 11a and 11b are exposed.

As shown in FIG. 11C, after the resist pattern 86 is removed, a metal which is the same metal for the metal plugs 13a and 13b and which is for forming metal plugs 63a and 63b are formed by the CVD method or the like so as to be embedded in the openings 81a and 81b. Thereafter, the resulting surface of the metal is planarized by the CMP method or the like, and a planarized surface is formed in which upper faces of the metal plugs 63a and 63b and of the insulating film 62 are flush with one another.

As shown in FIG. 11D, the insulating film 64 is formed so as to cover the upper faces of the metal plugs 63a and 63b and of the insulating film 62, and then, a resist pattern 87 is formed on the insulating film 64. This process is performed for forming an opening communicating with the metal plug 63a.

As shown in FIG. 12A, the insulating film 62 is etched by the RIE method or the like with the resist 87 as a mask, whereby an opening 82 is formed which is for forming a through-hole having a bottom portion through which the metal plug 63a is exposed.

As shown in FIG. 12B, after the resist pattern 87 is removed, a metal for forming a metal plug 67 is formed by the CVD method or the like so as to be embedded in the opening 82. Thereafter, the resulting surface of the metal is planarized by the CMP method or the like, a planarized surface formed of the metal plug 67 and the insulating film 64 is formed. The metal plug 67 is made of the same material as the metal plugs 13a and 13b of the first embodiment. To put it differently, the metal plug 67 is connected to the metal plug 63a via a thin barrier metal.

A subsequent part of the manufacturing method consists of the same processes as the process in the third embodiment shown in FIG. 9C and the processes following the process shown in FIG. 9C. Thereby, completed is the semiconductor device having substantially the same configuration as the semiconductor device 2 of the third embodiment except that a metal plug connected to the impurity diffusion layer 11a has a structure formed of the metal pugs 63a and 67 together forming a two-layer structure.

As a result, the semiconductor device of this embodiment has the same effects as the semiconductor device 2 of the third embodiment. Besides, each of the openings for the metal plugs 63a and 67 comes to have a structure having a smaller aspect ratio, that is, a shallower structure, than an opening formed at once such as the opening 72 of the third embodiment. Accordingly, ease and reliability of processing and embedding processes can be improved. In other words, manufacturing-process yields can be enhanced. Additionally, in a reverse logic, by being laminated as two layers, the metal plugs 63a and 67 can form a metal plug having a larger aspect ratio, and layout design of interconnections in the semiconductor device can be easier.

The present invention is not limited to the above described embodiments, and can be carried out in variously deformed forms without departing from the spirit of the present invention. For example, although the impurity diffusion layers 11a and 11b are formed on the lower faces of the metal plugs, it is possible to use interconnections or the like formed of conductors arranged at positions over and away from the semiconductor substrate, instead of these impurity diffusion layers 11a and 11b.

As further examples of possible modifications, the present invention is considered to have other configurations as described in the following.

A semiconductor device manufacturing method includes: forming a first insulating film on first and second conductors, the first and second conductors having upper faces flush with each other, the first and second conductors being formed, in a surface of a semiconductor substrate, or over and away from the semiconductor substrate, and being formed respectively in first and second regions provided to the semiconductor substrate; selectively forming, in the first insulating film, a first through-hole that communicates with the second conductor, embedding a third conductor in the first through-hole, and making a surface of the third conductor flush with the first insulating film; forming a second insulating film on the third conductor and the first insulating film, selectively forming, in the first and second insulating films, a second through-hole that communicates with the first conductor, embedding a fourth conductor in the second through-hole, and making a surface of the fourth conductor flush with the second insulating film; forming a third insulating film on the fourth conductor and the second insulating film; selectively etching the third insulating film in the first region so as to expose the fourth conductor through a bottom face of the third insulating film; selectively etching the third and second insulating films in the second region so as to expose the third conductor through a bottom face of the second insulating film; and forming a fifth conductor on the exposed third and fourth conductors and the first, second and third insulating films, and making the fifth conductor flush with the third insulating film.

A semiconductor device manufacturing method includes: forming a first insulating film on first and second conductors, the first and second conductors having upper faces flush with each other, the first and second conductors being formed, in a surface of a semiconductor substrate, or over and away from the semiconductor substrate, and being formed respectively in first and second regions provided to the semiconductor substrate; forming, in the first insulating film, first through-holes that respectively communicate with the first and second conductors, embedding third conductors in the first through-holes, and making surfaces of the third conductors flush with the first insulating film; forming a second insulating film on the third conductors and the first insulating film, forming, by selectively etching the second insulating film in the first region, a second through-hole that communicates with the first conductor, embedding a fourth conductor in the second through-hole, and making a surface of the fourth conductor flush with the second insulating film; forming a third insulating film on the fourth conductor and the second insulating film; selectively etching the third insulating film in the first region so as to expose the fourth conductor through a bottom face of the third insulating film; selectively etching the third and second insulating films in the second region so as to expose the third conductor through a bottom face of the second insulating film; and forming a fifth conductor on the exposed third and fourth conductors and the first, second and third insulating films, and making the fifth conductor flush with the third insulating film.

The invention claimed is:
1. A semiconductor device comprising:
first and second conductors provided in a surface of a semiconductor substrate or at positions over and away from the semiconductor substrate, and having upper faces flush with each other;
an insulating film formed so as to cover the upper faces of the first and second conductors, and having a uniform film thickness;
a first conductor plug formed in the insulating film, and connected to the first conductor;
a second conductor plug formed in the insulating film, having a lower height than the first conductor plug, and directly connected to the second conductor;
a first interconnection layer having a lower end portion connected to an upper end portion of the first conductive plug, the first interconnection layer being embedded in the insulating film, and an upper face of the first interconnection layer being flush with the insulating layer; and a second interconnection layer having a lower end portion connected to an upper end portion of the second conductive plug, the second interconnection layer being embedded in the insulating film, and an upper face of the second interconnection layer being flush with the insulating film, and the second interconnection layer is wider than the first interconnection layer.

2. The semiconductor device according to claim 1, wherein the insulating film has a laminated structure formed at least of:
- a lower-side insulating film flush with an upper end face of the first conductive plug; and
- an upper-side insulating film formed on the lower-side insulating film.

3. The semiconductor device according to claim 1, wherein the insulating film has a laminated structure formed at least of:
- a lower-side insulating film flush with an upper end face of the second conductive plug;
- an intermediate insulating film flush with an upper end face of the first conductive plug; and
- an upper-side insulating film formed on the intermediate insulating film.

4. The semiconductor device according to claim 1, wherein the insulating film is formed of at least one of a silicon oxide film, a carbon-containing silicon oxide film, or a silicon oxynitride film.

5. The semiconductor device according to claim 1, wherein the first and second interconnection layers are formed of a copper-based metal.

6. The semiconductor device according to claim 1, wherein the first and second interconnection layers are formed of a tungsten-based metal.

7. The semiconductor device according to claim 1, wherein the second interconnection layer is thicker than the first interconnection layer.

8. The semiconductor device according to claim 1, wherein the second conductor plug is wider than the first conductor plug.

9. The semiconductor device according to claim 1, wherein an upper surface of the second conducting plug is lower than that of an upper surface of the first conductor plug.

* * * * *